United States Patent

Mao et al.

[11] Patent Number: 5,877,073
[45] Date of Patent: Mar. 2, 1999

[54] MODIFIED POLY-BUFFERED LOCOS FORMING TECHNOLOGY AVOIDING THE POSITIVE CHARGE TRAPPING AT THE BEAK OF FIELD OXIDE

[75] Inventors: Pen-Liang Mao, Hsin-Chu; Jui Chi Chen, Taipei; Chen Ju-Cheng, Hsin-Chu City, all of Taiwan

[73] Assignee: Mosel Vitelic, Inc., Hsinchu, Taiwan

[21] Appl. No.: 646,019

[22] Filed: May 7, 1996

[51] Int. Cl.⁶ .................................................... H01L 21/76
[52] U.S. Cl. .......................... 438/585; 438/453; 438/439; 438/448
[58] Field of Search .................................... 438/443, 448, 438/585, 229, 906, 177, 193, 453

[56] References Cited

U.S. PATENT DOCUMENTS

| | | |
|---|---|---|
| H1041 | 4/1992 | Lux et al. . |
| 3,706,918 | 12/1972 | Barone et al. . |
| 4,014,772 | 3/1977 | Woods et al. . |
| 5,506,006 | 4/1996 | Chou et al. . |
| 5,538,917 | 7/1996 | Kunitou . |
| 5,543,343 | 8/1996 | Bryant et al. . |

*Primary Examiner*—George Fourson
*Attorney, Agent, or Firm*—Bacon & Thomas, PLLC

[57] ABSTRACT

A method for fabrication of modified poly-buffered LOCOS without positive charges trapping at the beak of the field oxide. The method employs DIW (Deionized Water) to be sprayed onto the wafer before gate electrode forming to eliminate the trapping of positive charges and reduce the undesired charge breakdown thereby increasing the yield of devices not containing this defect.

13 Claims, 3 Drawing Sheets

MODIFIED POLY-BUFFERED LOCOS FORMING TECHNOLOGY AVOIDING THE POSITIVE CHARGE TRAPPING AT THE BEAK OF FIELD OXIDE

BACKGROUND OF THE INVENTION

1. Field of the Invention

The present invention relates generally to the field of Local Oxidation of Silicon Isolation (LOCOS) forming technology, and more particularly, to a method of fabrication of modified poly-buffered LOCOS which can eliminate positive charge trapping at the beak of the field oxide.

2. Description of the Prior Art

LOCOS technology is currently employed most in the fabrication of Metal Oxide Semiconductor Field Effect Transistors (MOSFETs) and Bipolar Circuits to form the field oxide which acts as an isolation layer between active areas. A number of patents have addressed the LOCOS forming technology. U.S. Pat. No. 3,970,486 to E. Kooi, the entire disclosure of which is herein incorporated by reference, describes the processing steps as follows: A P-type substrate is provided, after which a layer of $SiO_2$ and a layer of silicon nitride are deposited. The pattern of said silicon oxide and silicon nitride is formed by conventional lithography technology. The wafer is thermally oxidized to make the field oxide—the silicon nitride layer here acts as an oxidation mask to avoid the undesired oxidation of the active area. The P-type doping is usually implanted before or after field oxide forming. $B^{+2}$ ions are implanted to build a P-type area in order to avoid the unwanted appearance of an inversion layer beneath field oxidation so it is helpful for insulation. The dose implanted before depositing of the oxidation layer is about 1E13 atoms/$cm^2$ to 5E13 atoms/$cm^2$ and the energy is of between about 110 to 130 KEV. The dose implanted after depositing of the oxidation layer is of between about 1E12 atoms/$cm^2$ to 5E12 atoms/$cm^2$ and the energy is of between about 170 to 190 KEV.

However, a so called "bird's beak" usually happens during LOCOS forming. Both the thinner silicon oxide layer and the thicker silicon nitride layer cause a longer bird's beak, and deteriorate the Crystal Defect of the silicon substrate. The lack of thickness of the bird's beak decreases the isolation ability of LOCOS as well. On the other hand, the active area is insufficient if the bird's beak is too thick. The bird's beak increases in thickness with the thickness of field oxide which increases during conventional processing. The thickness of the field oxide layer is usually increased in order to get enough threshold voltage and avoid leakage between devices, but a bird's beak of excessive length occurs at the same time. It affects the characteristic of the device and limits the ability to obtain high packing density.

U.S. Pat. No. 4,508,757 to Karen A. Fabricus, the entire disclosure of which is herein incorporated by reference, describes a method of manufacturing a minimum bird's beak recessed oxide isolation structure and approach called Poly-Buffered LOCOS process. The process steps are as follows: a silicon dioxide layer, a poly-buffered layer and a silicon nitride layer are formed in sequence. These layers are patterned by conventional lithography technology. The wafer is then subjected to an oxidation step employing said silicon nitride as an oxidation mask. The silicon nitride itself oxidizes very slowly, but is not penetrated by the oxygen. As a result, it protects the underlying silicon from oxidizing, while allowing a thermal $SiO_2$ layer to grow on regions of exposed silicon. Then the nitride and poly-buffered layers are stripped and the other processes for formation of the device are continued. The poly-buffered layer of the '757 patent decreases the length of the bird's beak by providing a thinner silicon dioxide and thicker silicon nitride layer. Compared to the conventional length of the bird's beak (0.5 micrometer), the length of the bird's beak in devices employing the poly-buffered layer is about 0.1 micrometer. Therefore, it provides an approach to obtain high packing density devices. However, the process still has some undesired aspects because the poly-buffered layer tends to form $SiO_2$ on its surface. For example, there is a significant level of positive charge traps at the PBLOCOS edge which cause early failure by charge breakdown.

SUMMARY OF THE INVENTION

In view of the foregoing, it is the principle object of the present invention to provide a modified and improved poly-buffered LOCOS method. The process of the present invention avoids positive charge trapping in the beak of the field oxide layer and avoids the charge breakdown which occurs in the prior art processes. The process steps of the invention are as follows:

(1) The silicon substrate is thermally oxidized to form a $SiO_2$ layer on the silicon substrate.

(2) A layer of polycrystalline silicon is deposited onto the formed $SiO_2$ layer to be poly-buffered.

(3) Silicon nitride is deposited onto the polycrystalline silicon layer.

(4) A pattern is formed on the silicon dioxide, polycrystalline silicon and silicon nitride layers by conventional lithography techniques.

(5) The wafer is then subjected to an oxidation step to form the active areas. The nitride layer employed here acts as an oxidation mask to define the desired active areas.

(6) The nitride layer is removed from the polycrystalline silicon surface using a stripping solution such as $H_3PO_4$. Then the polycrystalline silicon layer is removed from the $SiO_2$ layer by dry etching technology. Finally, the $SiO_2$ layer is removed from the substrate surface using a stripping solution such as HF with concentration 5%.

(7) A layer of sacrificed oxide is formed and then stripped directly.

(8) A gate oxide is formed.

(9) Deionized water is sprayed for 30 seconds to 5 minutes to the formed gate oxide.

(10) A layer of polycrystalline silicon is deposited onto the formed gate oxide layer and then a polycrystalline gate is formed on the gate oxide by conventional lithography and etching technology.

(11) The wafer is subjected to annealing in a high concentration $N_2$ chamber.

DESCRIPTION OF THE INVENTION

Figure 1:
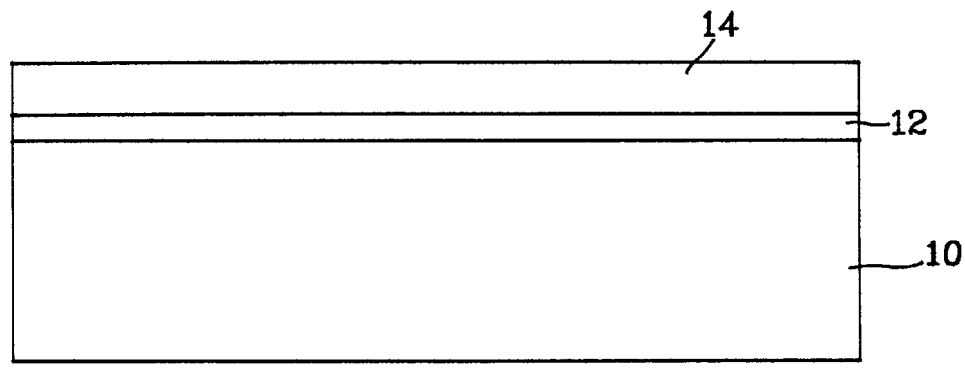
FIG. 1 is a cross-sectional representation of the forming of silicon dioxide layer onto the substrate and forming of polycrystalline silicon layer onto the silicon dioxide layer.
Figure 2:
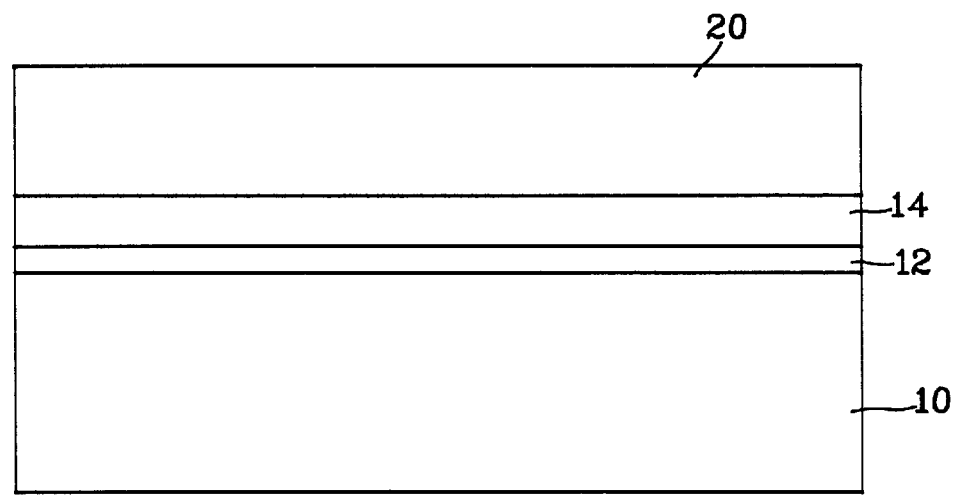
FIG. 2 is a cross-sectional representation of the forming of silicon nitride layer onto polycrystalline silicon layer.

Referring now more particularly to FIGS. 1 through 7, the manufacturing steps for an NPN bipolar transistor utilizing the method is described. FIG. 1 illustrates a P$^-$ substrate of monocrystalline silicon 10 having N$^+$ diffusion and P$^+$ isolation diffusion made therein by conventional techniques, which is thermally oxidized to form a silicon dioxide (SiO$_2$) layer 12 onto the monocrystalline silicon substrate 10. The substrate is typically a <100> crystallographic orientation silicon wafer having a resistivity on the order of 1 to 22 ohm-cm. The thermal growth process to form silicon dioxide layer 12 may be by conventional techniques at a temperature of between about 700° C. to 1000° C. in a dry oxygen ambient atmosphere. The preferred temperature is about 850° C. for this oxidation. The silicon dioxide layer 12 has an operative thickness from between about 10 to 500 nanometers and a preferred thickness of between about 20 to 50 nanometers. The polycrystalline silicon layer 14 is deposited onto the silicon dioxide layer 12 by low pressure vapor deposition at about 620° C. The system is preferably operated at a chamber pressure of about 200 mtorr. Reactants for this deposit are silane (SiH$_4$) alone for low pressure chemical vapor deposition. The polycrystalline silicon layer 14 has an operative thickness of between about 5 to 500 nanometers and a preferred thickness of between about 30 to 150 nanometers.

The silicon nitride layer 20 may be deposited by, for example, chemical vapor deposition or low pressure chemical vapor deposition in the temperature range of between about 700° C. to 1100° C. Reactants for this deposition are silicon tetrachloride and ammonia in a carrier gas such as hydrogen or nitrogen for chemical vapor depositions or dichlorosilane and ammonia either with or without a carrier gas such as nitrogen for low pressure chemical vapor deposition. The silicon nitride layer 20 has an operative thickness of between about 10 to 400 nanometers and a preferred thickness of between about 50 to 200 nanometers. The result of this structure is given in FIG. 2 wherein the silicon nitride layer 20 is shown.

Figure 3:
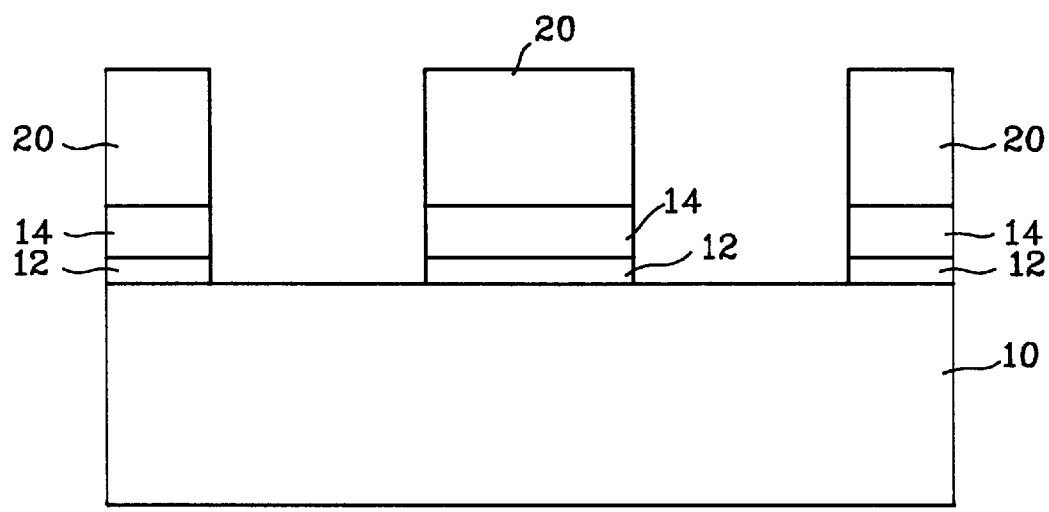
FIG. 3 is a cross-sectional representation of patterning the $SiO_2$, polycrystalline silicon and silicon nitride layers by etching technology.

The silicon dioxide layer 12, polycrystalline silicon layer 14, and silicon nitride layer 20 are now required to be patterned to form the mask pattern for the formation of the oxide isolation. This patterning is done by conventional lithographic and etching techniques. A photoresist layer is deposited over the top silicon nitride layer of the layered structure. The photoresist is exposed using conventional lithographic techniques. The photoresist mask is then utilized to first etch the silicon nitride layer 20, then the polycrystalline silicon layer 14 and finally the silicon dioxide layer 12. The photoresist layer is then removed from the surface using an appropriate photoresist stripping solution such as sulfuric acid in a plasma reactor. The result of this etching process is seen in FIG. 3. Various etching materials and processes can be used for this etching process, which include chemical, plasma, laser or reactive ion etching. However, this process uses reactive ion etching with Ar 320 sccm gas flow, CHF$_3$ 20 sccm gas flow and O$_2$ 50 sccm gas flow. The system is preferably operated at a chamber pressure of about 400 mtorr and an RF power of about 525 watts.

Figure 4:
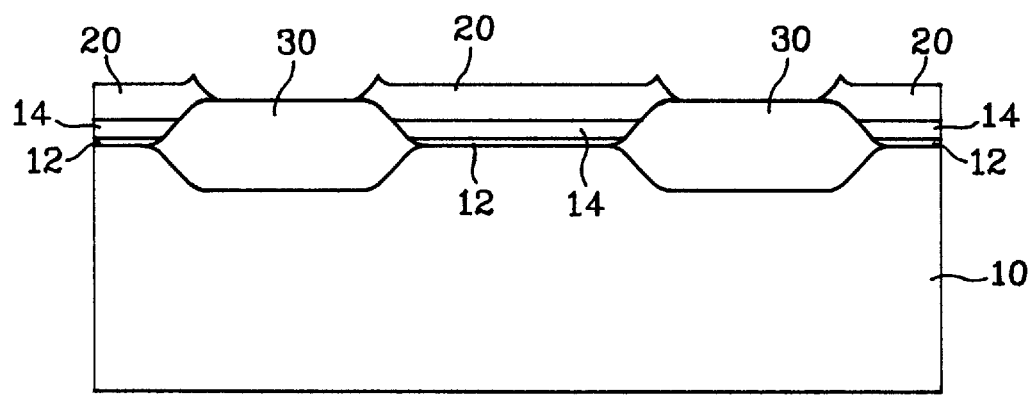
FIG. 4 is a cross-sectional representation of active areas formed by thermal oxidation. Silicon nitride layer is employed as an oxidation mask to define the desired areas.

As shown in FIG. 4, the wafer is then subjected to an oxidizing treatment which is accomplished by heating the body to a temperature of about 1000° C. in a ramped furnace using a stream of atmosphere for between about 150 to 480 minutes. The silicon nitride layer 20 used here acts as an oxidation mask to form field oxide layer 30 in the recessions. The thickness of the recessed field oxide layer 30 is typically between about 350 to 1000 nanometers and is preferably between about 450 to 650 nanometers.

Figure 5:
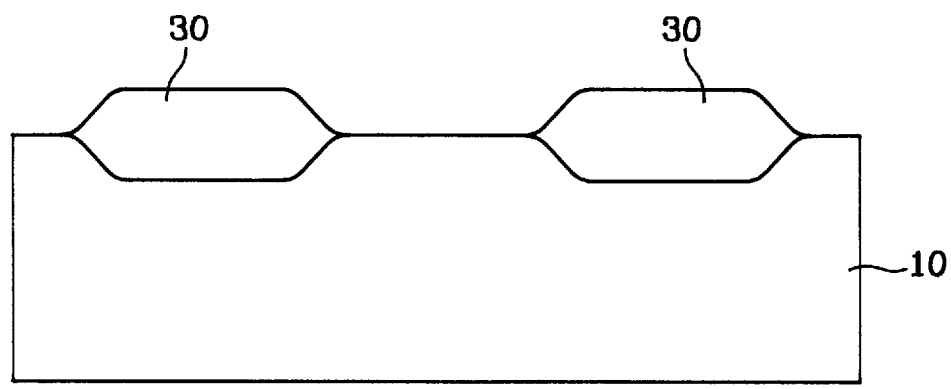
FIG. 5 is a cross-sectional representation that Nitride/polycrystalline silicon/silicon dioxide layers are removed by stripping solution or dry etching technology.

The silicon nitride layer 20 is now removed by using a hot phosphoric acid dip etching solution. The polycrystalline silicon layer 14 can now either be removed by dry etching techniques and the silicon dioxide layer 12 is removed by using a hydrogen fluoride acid dip etching solution having a concentration of about 5% HF. The sacrificed oxide layer is grown onto the surface field oxide layer 30 or substrate 10 and then is stripped right away by using a hydrogen fluoride acid dip etching solution. The result of this etching process is seen in FIG. 5.

The P-type doping is now implanted after field oxide layer 30 is formed. The area diffusion is typically boron using a surface concentration on the order of between about $10^{12}$ to $10^{13}$ atoms/cm$^2$, with implanted energy of between about 150 to 250 KeV and a preferred implanted energy of between about 170 to 190 KeV (not shown in the Figures).

Figure 6:
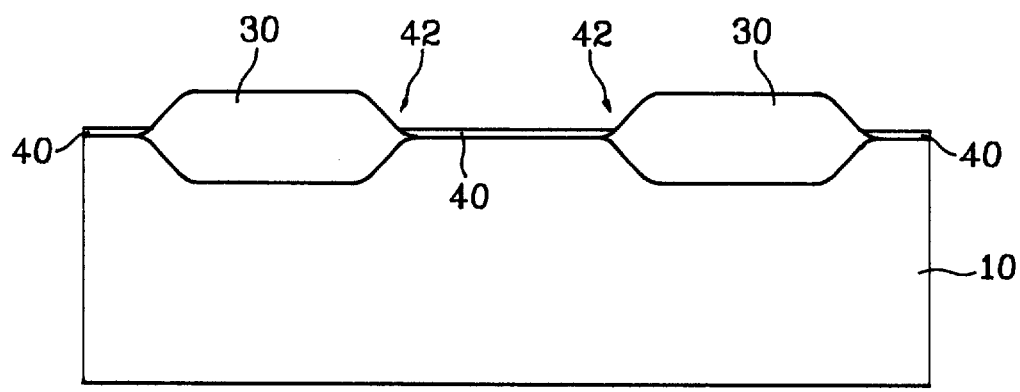
FIG. 6 is a cross-sectional representation of the gate oxide depositing after stripping the sacrificed layer.

Thereafter, the gate oxide layer 40 is directly formed. The gate oxide layer 40 has an operative thickness from between about 5 to 30 nanometers and preferably between about 10 to 15 nanometers. The result of forming gate oxide layer is seen in FIG. 6. The positive charges usually trap in the beak region of field oxide layer 30 wherein it is indicated at 42. Thereafter, the deionized water having a resistivity on the order above 30 ohm-cm from the nozzle of a wafer scrubber is sprayed onto the wafer for about 30 seconds to 5 minutes. The spinning wafer has a spin speed of between about 3000 rpm to 6000 rpm. The deionized water diffuses into the gate oxide layer 40 and beak of field oxide and forms electron traps which, after current stress, can neutralize the positive charges trapped at the PBLOCOS edge.

Figure 7:
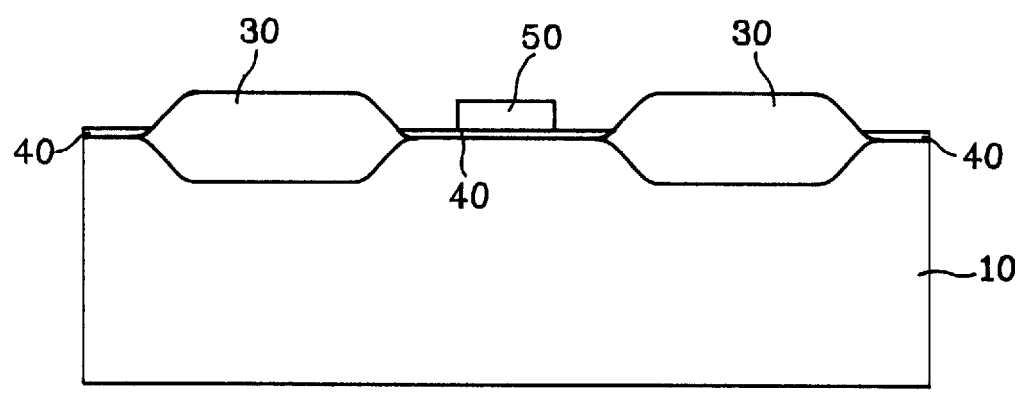
FIG. 7 is a cross-section representation of the polycrystalline gate forming by dry-etching and lithography after spraying with deionized water.

A polycrystalline silicon layer is next deposited onto the gate oxide layer 40 by low pressure vapor deposition at about 620° C. The system is preferably operated at a chamber pressure of about 200 mtorr. Reactants for this deposit are silane (SiH$_4$) alone for low pressure chemical vapor deposition. The polycrystalline silicon layer has an operative thickness of between about 200 to 500 nanometers and a preferred thickness of between about 250 to 300 nanometers. The polycrystalline silicon layer is then required to be pattered to form the polycrystalline gate 50. This patterning is done by conventional lithographic and etching techniques. A photoresist layer is deposited over the polycrystalline silicon layer and is exposed using conventional lithographic techniques. The photoresist layer is then removed from the surface using an appropriate photoresist stripping solution, such as sulfuric acid in a plasma reactor. The result of forming polycrystalline gate 50 pattern is seen in FIG. 7. Finally, the wafer is annealed at a temperature of between about 900° C. to 1000° C. and a preferred temperature of about 950° C. in a high concentration nitride ambient atmosphere. The annealing time is of between about 10 to 60 minutes.

While the invention has been particularly shown and described with reference to the bipolar transistor integrated circuit embodiments thereof, it will be understood by those skilled in the field effects transistor art, and other devices (for example, the MOS circuits and the CMOS circuits) that various changes in form and details may be made without departing from the spirit and scope of the invention.

What is claimed is:

1. A modified poly-buffered LOCOS process avoiding positive charge trapping at the beak of a field oxide which comprises the steps of: (a) depositing a layer of $SiO_2$ onto a silicon substrate, (b) depositing a layer of polycrystalline silicon onto the $SiO_2$ layer, (c) forming a layer of silicon nitride onto the polycrystalline silicon, (d) forming a pattern in the $SiO_2$ polycrystalline silicon and silicon nitride layers by etching technology, (e) subjecting said silicon substrate to an oxidation step to make a field oxide layer, wherein said silicon nitride acts as an oxidation mask; (f) forming a layer of sacrificial oxide and then stripping said sacrificial oxide, thereafter depositing a layer of gate oxide, (g) spraying deionized water onto said silicon substrate to neutralize said positive charges trapped in said field oxide, (h) forming and patterning a polysilicon gate over said gate oxide, and (i) subjecting said silicon substrate to an annealing step.

2. A method according claim 1, wherein said $SiO_2$ layer is formed at a temperature ranging from 700° C. to 1000° C.

3. A method according claim 1, wherein said $SiO_2$ layer has a thickness of between 10 to 500 nanometers.

4. A method according claim 1, wherein said polycrystalline silicon layer has a thickness of between 5 to 500 nanometers.

5. A method according claim 1, wherein said silicon nitride layer has a thickness of between 5 to 500 nanometers.

6. A method according claim 1, wherein said field oxide layer has a thickness of between 350 to 1000 nanometers.

7. A method according claim 1, wherein said polysilicon gate has a thickness of between 200 to 500 nanometers.

8. A method according claim 1, wherein said silicon substrate is spinning during the deionized water spraying step and the spin speed of said silicon substrate is from 3000 to 6000 rpm.

9. A method according to claim 1, wherein the deionized water is ejected from the nozzle of a wafer scrubber for between about 30 seconds to 5 minutes.

10. A method according to claim 1, wherein the deionized water has a resistivity on the order of about 30 ohm-cm.

11. A method according claim 1, wherein said silicon substrate is annealed at a temperature of between about 900° C. to 1000° C.

12. A method according claim 1, wherein said silicon substrate is annealed in a nitrogen ambient atmosphere.

13. A method according to claim 1, wherein the annealing time of the wafer is between about 10 to 60 minutes.

* * * * *